(12) United States Patent
Kamei et al.

(10) Patent No.: US 6,723,914 B1
(45) Date of Patent: Apr. 20, 2004

(54) COMPOSITE MAGNETIC TAPE

(75) Inventors: Koji Kamei, Kawasaki (JP); Norihiko Ono, Yokohama (JP); Mitsuharu Sato, Yokohama (JP)

(73) Assignee: NEC Tokin Corp, Miyagi (JP)

( * ) Notice: Subject to any disclaimer, the term of this patent is extended or adjusted under 35 U.S.C. 154(b) by 0 days.

(21) Appl. No.: 09/598,487

(22) Filed: Feb. 23, 2000

Related U.S. Application Data

(63) Continuation-in-part of application No. 09/068,065, filed as application No. PCT/JP97/03045 on Sep. 1, 1997, now abandoned.

(51) Int. Cl.⁷ .................... H01B 11/06; H01F 1/04; B22F 3/00; B32B 15/04
(52) U.S. Cl. .................... 174/35 R; 148/307; 148/308; 148/309; 420/78; 420/103; 420/117; 252/62.54; 252/62.55; 428/174; 428/343; 428/900
(58) Field of Search ................. 428/343, 147, 428/900; 148/307, 308, 309; 252/62.55, 62.54; 420/78, 103, 117; 174/35 R

(56) References Cited

U.S. PATENT DOCUMENTS

| | | | | |
|---|---|---|---|---|
| 4,996,110 A | * | 2/1991 | Tanuma et al. | 428/343 |
| 5,207,841 A | * | 5/1993 | Shigeta et al. | 148/307 |
| 5,260,128 A | * | 11/1993 | Ishii et al. | 428/328 |
| 6,048,601 A | * | 4/2000 | Yahagi et al. | 428/147 |

FOREIGN PATENT DOCUMENTS

| | | |
|---|---|---|
| JP | 03-059129 | 3/1991 |
| JP | 06-292630 | 10/1994 |
| JP | 07-212079 | 11/1995 |
| WO | 9523384 | 9/1995 |

* cited by examiner

*Primary Examiner*—Daniel Zirker
*Assistant Examiner*—Victor S Chang
(74) *Attorney, Agent, or Firm*—Bradley N Ruben

(57) ABSTRACT

There is provided a composite magnetic tape which can be easily applied irrespective of the inside or outside of an electronic equipment, prevent radiation of undesired electromagnetic waves from the inside of the equipment and reflection into the inside of the equipment, and shield electromagnetic noise from the outside of the equipment. The tape may be in the form of an adhesive tape or a self-welding tape. The tape is constituted of a composite magnetic layer formed by dispersing soft magnetic powder into an organic binding agent. Alternatively, it may have a stacked structure of a composite magnetic layer and a conductor layer.

5 Claims, 4 Drawing Sheets

US 6,723,914 B1

COMPOSITE MAGNETIC TAPE

This application is a continuation of Ser. No. 09/068,065, filed as Pct/JP97/03045 filed Sep. 1, 1997, abandoned

TECHNICAL FIELD

The present invention relates to means for electromagnetic shielding and electromagnetic noise suppression in the electric and electronic industries and, in particular, to a tape to be used therefor.

BACKGROUND ART

Conventionally, in the electric and electronic industries, tapes using Cu, Al or stainless sheets have been known for magnetic shielding or electric connection. Such a tape has a width of about 10 to 20 mm and a thickness of about 0.1 to 0.3 mm, and is wound in a belt fashion. Adhesive tapes obtained by applying an adhesive to the foregoing Cu, Al or stainless tapes have also been known. Further, as self-welding tapes, those obtained by applying a self-welding agent, such as polyester or polyamide, to the foregoing Cu, Al or stainless tapes have been known.

There is a possibility that electronic equipments may malfunction due to undesired electromagnetic waves (electromagnetic noise) from the exterior. As such electromagnetic noise, there are electromagnetic waves caused by other communications, undesired electromagnetic waves radiated from various kinds of equipments and devices used therein, and electromagnetic waves due to reflection. Therefore, shielding is essential in electronic equipments and various kinds of equipments radiating undesired electromagnetic waves for preventing radiation of the electromagnetic waves and invasion of the electromagnetic waves from the exterior.

In view of this, conductor plates (shield plates) have been used in these equipments. If the shield plates are used, the number of parts of the equipment is increased to cause high cost.

Accordingly, for realizing a shield effect easily and cheaply, it is considered to use the foregoing tapes.

However, the foregoing conventional tape is small in magnetic shield effect relative to high frequency waves of portable telephones, PHS's, transceivers, electronic equipments or the like, particularly, electromagnetic waves at several hundred to thousand MHz bands. Therefore, there has been necessity for such tapes as having the magnetic shield effect over the wide frequency band, instead of the conventional tapes.

Further, if the foregoing tape or shield plate is used carelessly, there is raised a problem that the tape or shield plate may function as an antenna or secondary radiant noise due to reflection may be generated, so as to cause an influence to other devices in the same equipment.

An object of the present invention is to provide an electromagnetic interference suppressing tape which can protect an equipment from undesired electromagnetic waves from the exterior and prevent even radiant noise and/or reflection noise in the same equipment, and further can be easily used.

DISCLOSURE OF THE INVENTION

The present invention, as recited in claim 1, provides a composite magnetic tape characterized by comprising a thin film of a composite magnetic body formed by dispersing soft magnetic powder into an organic binding agent.

Further, the present invention, as recited in claim 2, provides a composite magnetic tape characterized by comprising a thin film of a multilayered structure in which a composite magnetic layer formed by dispersing soft magnetic powder into an organic binding agent and a conductor layer are stacked.

Modifications by the present invention and typical examples of carrying-out manners are recited in dependent claims.

BEST MODE FOR CARRYING OUT THE INVENTION

Hereinbelow, embodiments of the present invention will be described with reference to the drawings.

Figure 1:
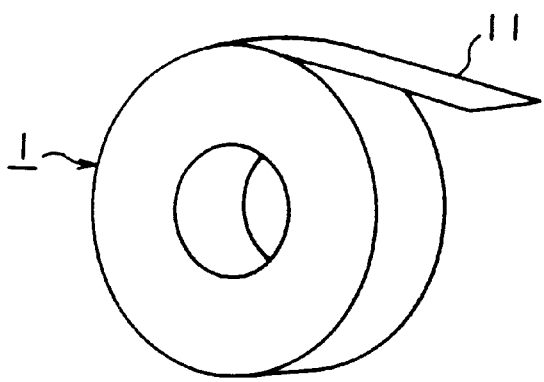
FIG. 1 is a perspective view of a composite magnetic tape according to the present invention.

Referring to FIG. 1, the shown embodiment shows a roll 1 formed by winding a tape 11 composed of only a thin film of a composite magnetic body formed by dispersing soft magnetic powder into an organic binding agent.

Figure 4:
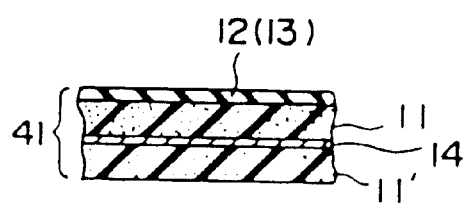
FIG. 4 is a sectional view of a composite magnetic tape constituted of two composite magnetic layers and a metal layer and provided with an adhesive layer.

As shown by 11, 11' in FIG. 4, a section of the tape 11 has a structure in which the soft magnetic powder (shown by dots) is dispersed into a layer of the organic binding agent (shown by hatching of oblique thick lines).

As the foregoing soft magnetic powder, an Fe-Al-Si alloy or an Fe-Ni alloy having a large high frequency permeability can be cited.

As the foregoing organic binding agent, thermoplastic resin, such as polyester resin, polyvinyl chloride resin, polyvinyl butyral resin, polyurethane resin, cellulose resin, nitrile-butadiene rubber or stylene-butadiene rubber, or a polymer thereof can be cited. Further, chlorinated polyethylene can also be used. Particularly, an elastomer having elasticity is suitable for tape.

Figure 2:
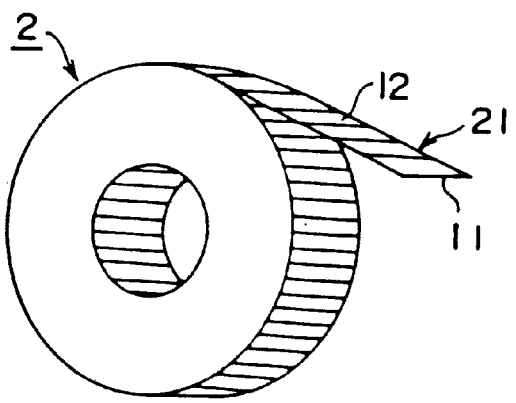
FIG. 2 is a perspective view of a composite magnetic tape provided with an adhesive layer according to the present invention.

Referring to FIG. 2, the shown embodiment shows a roll 2 formed by winding an adhesive tape 21 which is obtained by applying a thin layer 12 (in the figure, shown by hatching of horizontal lines) of an adhesive onto the surface of a tape 11 constituted of a thin film of a composite magnetic body formed by dispersing soft magnetic powder into an organic binding agent.

Figure 3:
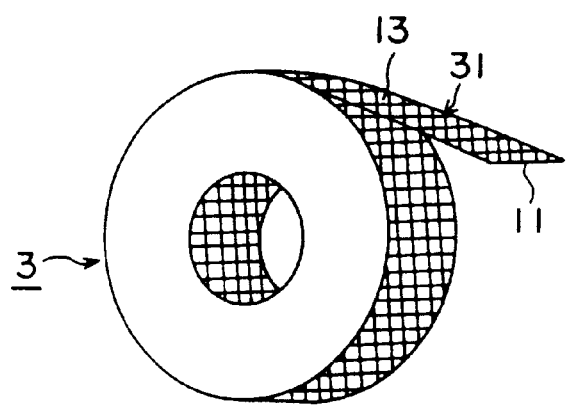
FIG. 3 is a perspective view of a composite magnetic tape provided with a self-welding layer according to the present invention.

Referring to FIG. 3, the shown embodiment shows a roll 3 formed by winding a self-welding tape 31 which is obtained by applying a thin layer 13 (in the figure, shown by hatching of mesh) of a self-welding agent onto the surface of a tape 11 constituted of a thin film of a composite magnetic body formed by dispersing soft magnetic powder into an organic binding agent.

FIG. 4 shows an example in which a thin film forming a tape has a stacked structure of layers of composite magnetic bodies and a metal layer. The shown example is an adhesive tape 41 of a structure, wherein a metal layer 14 is interposed between tape layers 11 and 11' composed of composite magnetic bodies, and an adhesive layer 12 is provided on the surface of the tape layer 11 composed of the composite magnetic body.

As the metal layer, a metal foil, a net made of metal wires (metal mesh), an electroless plating layer, a deposited metal layer or the like may be used.

On the other hand, a self-welding agent layer 13 may be used instead of the adhesive layer 12 so as to form a self-welding tape. For showing this, (13) is added adjacent to reference sign 12 in the figure. Naturally, if not necessary, the adhesive layer 12 and the self-welding agent layer 13 both can be omitted.

One composite magnetic layer is acceptable. On the other hand, a plurality of composite magnetic layers and metal layers may be stacked.

Table 1 shows an example of the composite magnetic body used in the embodiments shown in FIGS. 1 to 4.

TABLE 1

| FLAT Soft magnetic powder | 80 weight parts |
|---|---|
| Fe—Al—Si alloy | |
| Average particle diameter: 45 μm | |
| Aspect ratio: >5 | |
| Annealing: Ar atmosphere | |
| 650° C., 2 hours | |
| Organic binding agent | 20 weight parts |
| (chlorinated polyethylene) | |

The composite magnetic body was produced in the following manner. The soft magnetic powder obtained by a normal method was vapor-phase oxidized in an atmosphere of nitrogen-oxygen mixed gas at a 20% oxygen partial pressure, and oxide films were formed on the surfaces thereof. The powder and chlorinated polyethylene were heated and kneaded, and then formed under pressure to obtain a formed body of the composite magnetic body. The surface resistance of the composite magnetic body was measured and found to be $1 \times 10^6 \Omega$.

Figure 5:
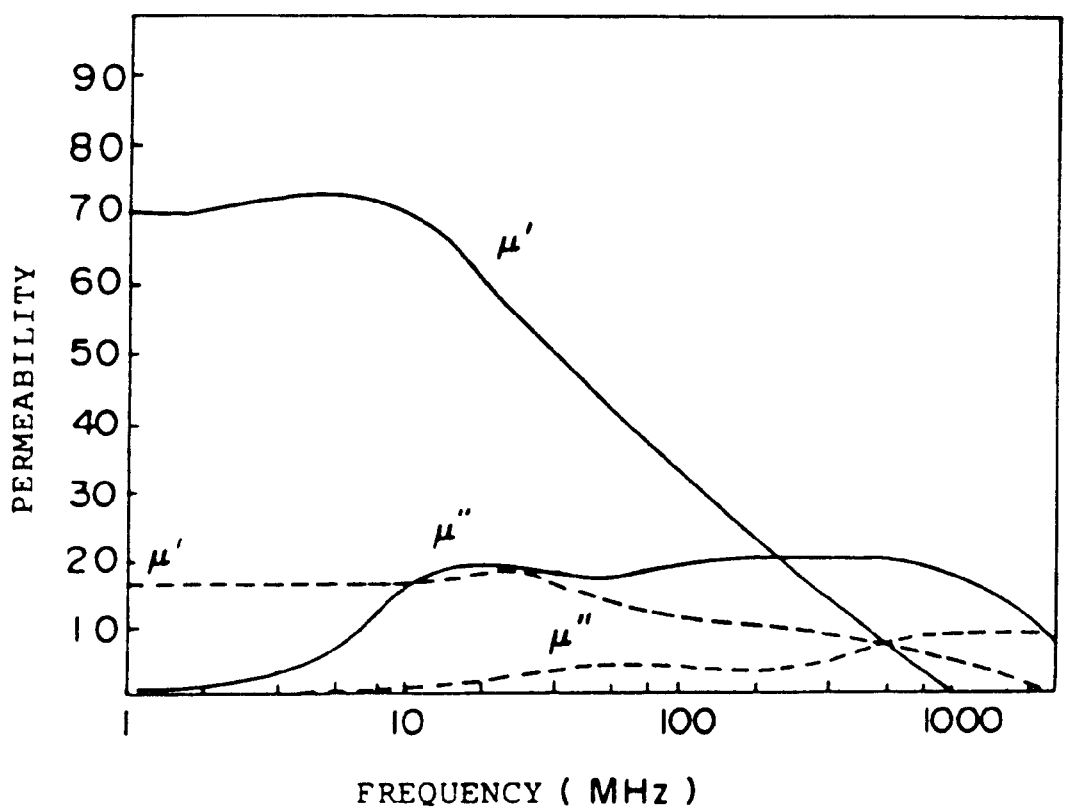
FIG. 5 is a $\mu$-f characteristic diagram of a composite magnetic body used in a composite magnetic tape of the present invention.

FIG. 5 shows a measured $\mu$-f (permeability-frequency) characteristic of the foregoing composite magnetic body. Solid lines represent $\mu$ characteristics after annealing, while broken lines represent $\mu$ characteristics before annealing. As shown In FIG. 5, the composite magnetic body before annealing has peaks in $\mu''$ (complex permeability) which appear following the magnetic resonance, and it is observed that the magnetic resonance occurs at two points. After it is subjected to the annealing, it is seen that $\mu''$ reveals high values over a wide range, and $\mu''$ also reveals large values at high frequencies.

Hereinbelow, examples of composite magnetic tapes according to the present invention will be described.

Using the composite magnetic body shown in Table 1, as shown in FIG. 1, a tape 11 having a mean width of 15 mm and a mean thickness of 0.3 mm was formed.

Example 2

As shown in FIG. 4, the composite magnetic body of Table 1 was formed into two layers 11 and 11' and a nickel mesh was interposed therebetween as a conductor layer 7, to form a multilayered structure so that a tape composed of a thin belt 2 having a mean dimension of 15 mm and a mean thickness of 0.3 mm was formed. The nickel mesh of 100 meshes with t=0.05 mm was used. In this example, neither the adhesive layer 12 nor the self-welding layer (13) was used.

Example 3

Using the composite magnetic body of Table 1, a tape 11 having a mean width of 15 mm and a mean thickness of 0.3 mm was formed. Then, as shown in FIG. 2, an adhesive 12 having electrically insulating and conductive properties was applied to the tape 11 to obtain an adhesive tape 21.

Example 4

As shown in FIG. 4, the composite magnetic body of Table 1 was formed into two layers 11 and 11' and a nickel mesh was interposed therebetween as a conductor layer 7, to form a multilayered structure so that a tape composed of a thin belt having a mean width of 15 mm and a mean thickness of 0.3 mm was formed. An adhesive layer 12 was applied to the surface of the tape to obtain an adhesive tape 41. The nickel mesh of 100 meshes with t=0.05 mm was used.

Example 5

Using the composite magnetic body shown in Table 1, a tape 11 having a mean width of 15 mm and a mean thickness of 0.3 mm was formed. Then, as shown in FIG. 3, a self-welding layer 13 made of epoxy resin as a main component was applied to the tape 11 to obtain a self-welding tape 31. As the main component of the self-welding layer, polyamide resin, polyester resin or the like may be used other than the epoxy resin.

As shown in FIG. 4, the composite magnetic body of Table 1 was formed into two layers 11 and 11' and a nickel mesh was interposed therebetween as a conductor layer 7, to form a multilayered structure so that a tape composed of a thin belt having a mean width of 15 mm and a mean thickness of 0.3 mm was formed. The foregoing self-welding agent 13 was applied to the tape to obtain a self-welding tape 41. The nickel mesh of 100 meshes with t=0.05 mm was used.

With respect to samples of the examples 1 to 6, transmittance attenuation levels and coupling levels were measured, respectively.

Figure 8:
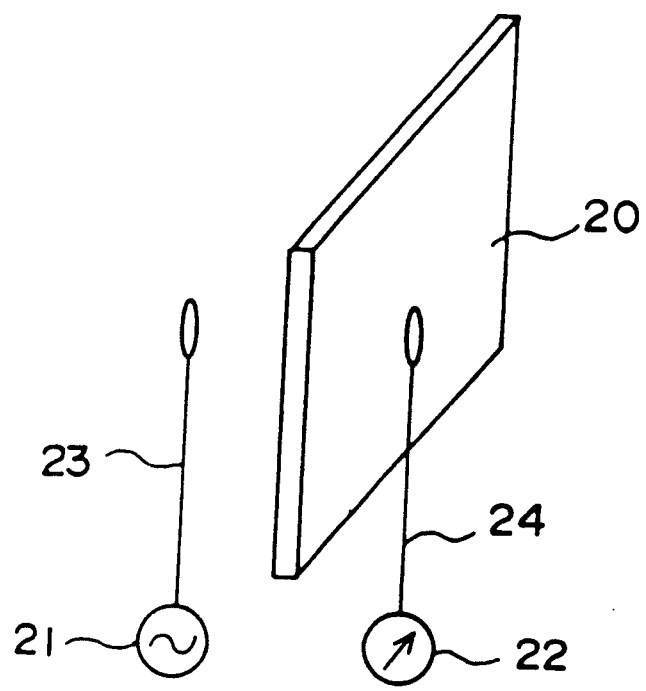
FIG. 8 is an explanatory diagram showing a measuring method of the transmittance attenuation level.
Figure 9:
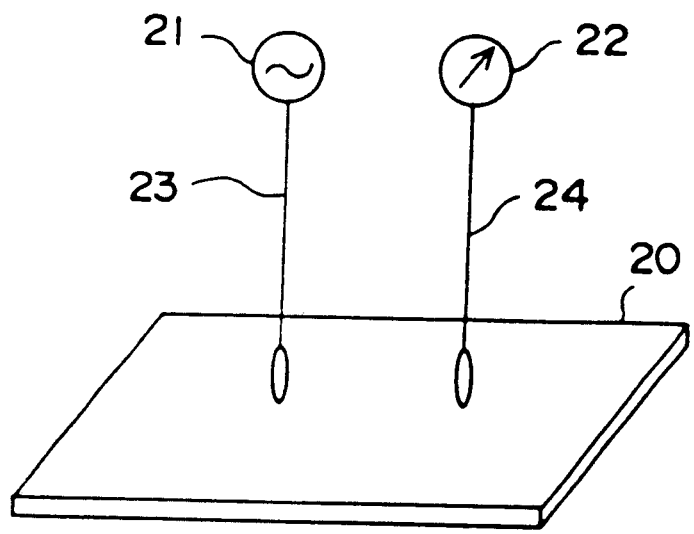
FIG. 9 is an explanatory diagram showing a measuring method of the coupling level.

As shown in FIGS. 8 and 9, an apparatus having an electromagnetic wave generator 21 and an electromagnetic field strength measuring device (reception element) 22, which were connected to an electromagnetic field transmitting macro-loop antenna 23 and an electromagnetic field receiving micro-loop antenna 24 each having a loop diameter of not greater than 2 mm, was used in the measurement. A spectrum analyzer, not shown, was connected to the electromagnetic field strength measuring device 22, and the measurement was carried out using as a reference an electromagnetic field strength in the state where no sample was present.

In the measurement of the transmittance attenuation level, as shown in FIG. 8, a sample 20 was disposed between the electromagnetic field transmitting micro-loop antenna 23 and the electromagnetic field receiving micro-loop antenna 24.

In the measurement of the coupling level, as shown in FIG. 9, the sample 20 was disposed so that one side thereof confronts the electromagnetic field transmitting micro-loop antenna 23 and the electromagnetic field receiving micro-loop antenna 24.

Figure 6:
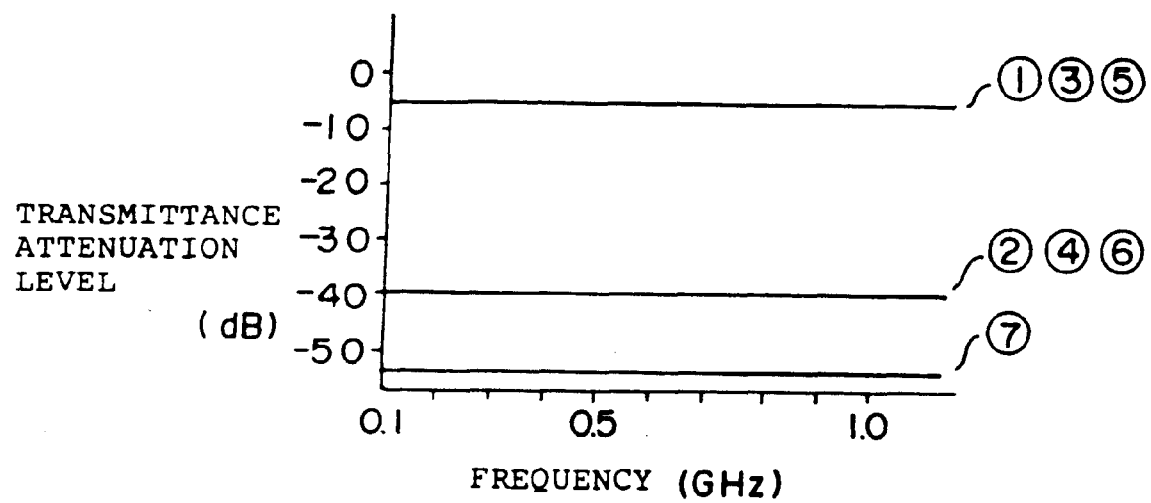
FIG. 6 is a graph showing transmittance attenuation levels of samples according to the present invention and a comparative sample.
Figure 7:
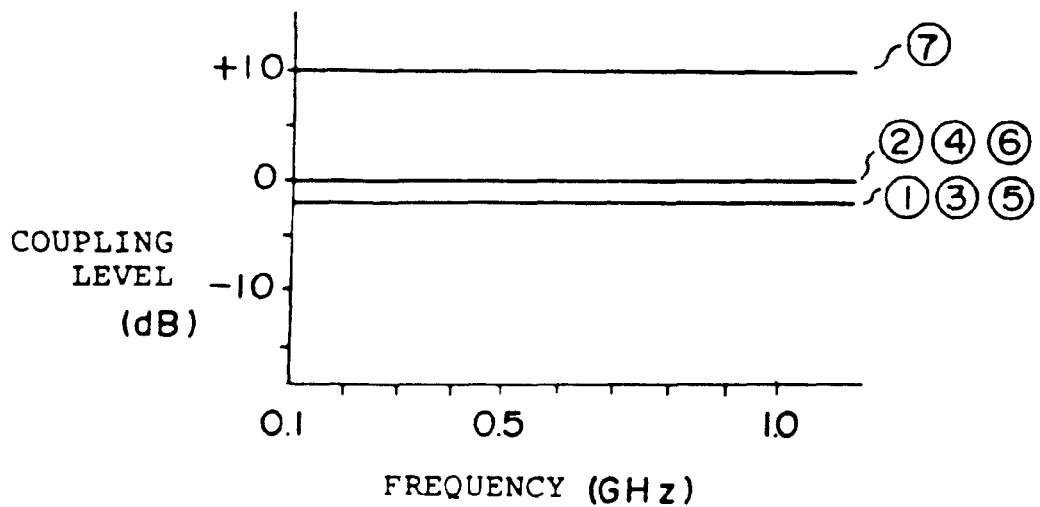
FIG. 7 is a graph showing electromagnetic coupling levels of the same samples.

The transmittance attenuation levels and the coupling levels measured by the foregoing method are shown in FIGS. 6 and 7, respectively. In the figures, characteristics of the examples 1 to 6 are shown by ⓪ to ⑥ and, as a comparative example, characteristics of a metal shield plate in the form of a copper plate with a thickness t=0.035 mm are shown by ⑤.

As seen from FIGS. 6 and 7, in the examples 1 to 6 according to the present invention, the transmittance attenuation levels and the coupling levels are both reduced. On the contrary, in the comparative example, it is seen that although the transmittance attenuation level is much reduced, the coupling level is increased. From the foregoing results, it is seen that the composite magnetic tape according to the present invention can effectively remove the radiant noise without inducing the secondary radiant noise due to reflection.

Industrial Applicability

According to the present invention, it is possible to provide a tape which can prevent high frequency radiation and reflection noise easily, like an insulating tape for electric insulation, without inducing secondary radiation, using a tape, an adhesive tape or a self-welding tape constituted of a composite magnetic body which can keep an electromagnetic absorption effect even at a high frequency band.

What is claimed is:

1. An electromagnetic interference suppressing tape comprising a thin film with a surface and an adhesive layer deposited on the surface of the thin film, said thin film comprising a composite magnetic body which comprises a soft magnetic metallic powder having a flat configuration and having been annealed at a temperature of at least about 650° C., and an organic binding agent in which said soft magnetic powder is dispersed, said composite magnetic body having a magnetic characteristic wherein a magnetic resonance occurs at least at two different frequency points.

2. An electromagnetic interference suppressing composite magnetic tape as claimed in claim 1, wherein said adhesive layer is a layer of a self-welding agent.

3. An electromagnetic interference suppressing tape as claimed in claim 1, wherein said organic binding agent is an elastomer.

4. An electromagnetic interference suppressing tape as in claim 1, wherein said soft magnetic power is a soft magnetic metallic power having a metallic oxide film formed on a surface of a powder.

5. An electromagnetic interference suppressing tape as claimed in claim 1, wherein said thin film comprises a stack wherein at least two sheets of composite magnetic body and at least one conductive layer are alternately stacked.

* * * * *